United States Patent
Hartano et al.

(10) Patent No.: US 6,941,498 B2
(45) Date of Patent: Sep. 6, 2005

(54) TECHNIQUE FOR DEBUGGING AN INTEGRATED CIRCUIT HAVING A PARALLEL SCAN-CHAIN ARCHITECTURE

(75) Inventors: Ismed D. S. Hartano, Castro Valley, CA (US); Fidel Muradali, Mountain View, CA (US); John S. Walther, Sunnyvale, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 416 days.

(21) Appl. No.: 10/093,178

(22) Filed: Mar. 7, 2002

(65) Prior Publication Data

US 2003/0172334 A1 Sep. 11, 2003

(51) Int. Cl.$^7$ .......................... G01R 31/28; G06F 11/00
(52) U.S. Cl. ................................. 714/729; 714/736
(58) Field of Search ........................ 714/724–729, 714/736

(56) References Cited

U.S. PATENT DOCUMENTS

| | | |
|---|---|---|
| 5,668,490 A | 9/1997 | Mitra et al. |
| 5,983,380 A * | 11/1999 | Motika et al. ............. 714/733 |
| 6,145,105 A | 11/2000 | Nadeau-Dostie et al. |
| 6,557,129 B1 * | 4/2003 | Rajski et al. ............. 714/729 |

OTHER PUBLICATIONS

Ilker Hamzaoglu et al., Reducing Test Application Time For Build–in–Self–Test Test Pattern Generators, IEEE VLSI Test Symposium (Apr. 2000), (7 pgs.).

* cited by examiner

Primary Examiner—Albert Decady
Assistant Examiner—Cynthia Britt

(57) ABSTRACT

The present disclosure describes a technique for debugging an integrated circuit having a parallel scan-chain architecture. Blocking circuits are introduced at the inputs and/or outputs of scan-chain branches. The blocking circuits allow the inputs to and/or the outputs from the scan-chain branches to be selectively blocked. This allows individual scan-chain branches to be isolated and debugged.

16 Claims, 6 Drawing Sheets

TECHNIQUE FOR DEBUGGING AN INTEGRATED CIRCUIT HAVING A PARALLEL SCAN-CHAIN ARCHITECTURE

BACKGROUND OF THE INVENTION

1. Field of the Invention

The present invention relates to integrated circuits and, more particularly, to a technique for debugging an integrated circuit having a parallel scan-chain architecture.

2. Related Art

Scan-based design techniques are often used so that integrated circuit devices can be tested. An integrated circuit device designed using scan-based design techniques operates in two modes: normal mode and testing mode. When operating in normal mode, the integrated device performs the functions that it was designed to perform. When operating in testing mode, the integrated circuit device can be tested. Testing mode typically includes the following sub-modes: scan mode and capture mode. When operating in scan mode, the storage elements (e.g., flip-flops) within the integrated circuit device are connected to one another to form one or more scan-chains. When operating in capture mode, the storage elements are connected to one another and/or to combinational logic in the same fashion that they would be if operating in normal mode.

There are two common scan-chain architectures: serial and parallel. FIG. 1 shows an integrated circuit device 100 having a serial scan-chain architecture. Integrated circuit device 100 can be tested as follows. First, integrated circuit device 100 is placed in scan mode. This causes a single scan-chain to be formed using some or all of the storage elements 120 within integrated circuit device 100. Second, test data bits are scanned into the storage elements 120 via scan input signal line SI. Third, integrated circuit device 100 is placed in capture mode. Fourth, integrated circuit device 100 is allowed operate for one or more clock cycles in capture mode. This allows the functionality of the storage elements 120 and any combinational logic connected to storage elements 120 to be tested. Fifth, integrated circuit device 100 is placed in scan mode. Sixth, the data bits that reside in storage elements 120 (i.e., the resulting data bits) are scanned out of integrated circuit device 100 via scan output signal line SO. Seventh, the resulting data bits are compared to expected data bits to determine whether there are any faults, i.e., whether any of storage elements 120 or any combinational logic (not shown) connected to storage elements 120 is not operating properly.

A problem with the serial scan-chain architecture of integrated circuit device 100 is that it requires a very large number of test data bits to be generated to test integrated circuit device 100. Another problem with the serial scan-chain architecture of integrated circuit device 100 is that it requires a very large amount of time to test integrated circuit device 100. To address these problems, parallel scan-chain architectures have been developed.

FIG. 2 shows an integrated circuit device 200 having a parallel scan-chain architecture. Integrated circuit device 200 includes multiple scan-chain branches 210 (separately labeled 210-1, 210-2, . . . , 210-N). Each scan-chain branch 210 includes some of the storage elements 220 on integrated circuit device 210. Integrated circuit device 200 can be tested as follows. First, integrated circuit device 200 is placed in scan mode. Second, test data bits are scanned into storage elements 220 of each scan-chain branch 210 via scan input signal line SI. As a result, identical test data bits are stored in storage elements 220 of each scan-chain branch 210. Third, integrated circuit device 200 is placed in capture mode. Fourth, integrated circuit device 200 is allowed operate for one or more clock cycles in capture mode. This allows the functionality of the storage elements 220 and any combinational logic connected to storage elements 220 to be tested. Fifth, integrated circuit device 200 is placed in scan mode. Sixth, the data bits that are stored in storage elements 220 of each scan-chain branch 210 (i.e., the resulting data bit streams) are scanned out of each scan-chain branch 210, combined using combiner 230 (e.g., an XOR gate), and output via signal line SO. Note that combiner 230 combines the resulting data bit streams output by each scan-chain branch 210 and generates a single common resulting data bit stream that is output via signal line SO. Seventh, the common resulting bit stream is compared to an expected data bit stream to determine whether there are any faults, i.e., whether any of storage elements 220 or any combinational logic (not shown) between storage elements 220 is not operating properly.

A problem with the parallel scan-chain architecture of integrated circuit device 200 is that if there is a fault either in scan mode or capture mode, it is difficult to determine which scan-chain branch or branches 210 is/are not operating properly. This is because the resulting data bit streams output by each scan-chain branch 210 are combined into a single common resulting data bit stream. As a result, if a fault occurs in one of the scan-chain branches 210, it is difficult to identify the scan-chain branch or branches 210 that have the fault and thus it is difficult to pinpoint the location of the fault(s) within integrated circuit device 200.

Accordingly, what is needed is a technique for debugging an integrated circuit device having a parallel scan-chain architecture.

SUMMARY OF THE INVENTION

The present invention provides blocking circuits at the inputs and/or outputs of scan-chain branches. The blocking circuits allow the inputs to and/or the outputs from the scan-chain branches to be selectively blocked. This allows individual scan-chain branches to be isolated and debugged.

Other embodiments, aspects, and advantages of the present invention will become apparent from the following descriptions and the accompanying drawings.

BRIEF DESCRIPTION OF THE DRAWINGS

For a more complete understanding of the present invention and for further embodiments, aspects, and advantages, reference is now made to the following description taken in conjunction with the accompanying drawings, in which.

Like reference numerals are used for like and corresponding parts of the various drawings.

DETAILED DESCRIPTION OF THE INVENTION

The detailed description includes two sections. Section I describes an integrated circuit device that includes the input blocking circuits and the output blocking circuits of the present invention. Section II, Part A describes an exemplary testing method. Section II, Part B describes a debugging method using the output blocking circuits of the present invention. Section II, Part C describes a debugging method using the input blocking circuits of the present invention.

I. Integrated Circuit Device Architecture

Figure 1:
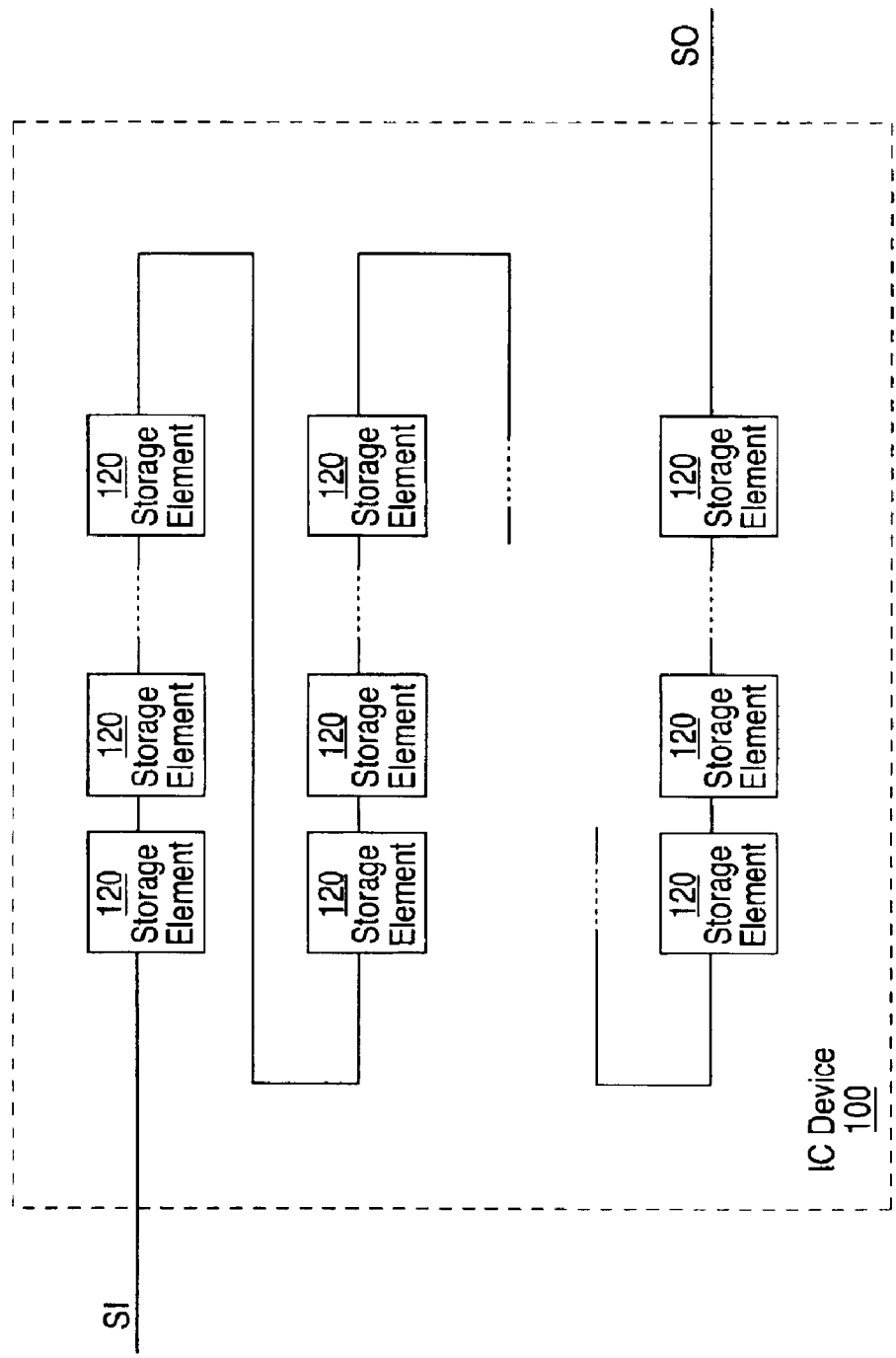
FIG. 1 shows an integrated circuit device having a serial scan-chain architecture.
Figure 2:
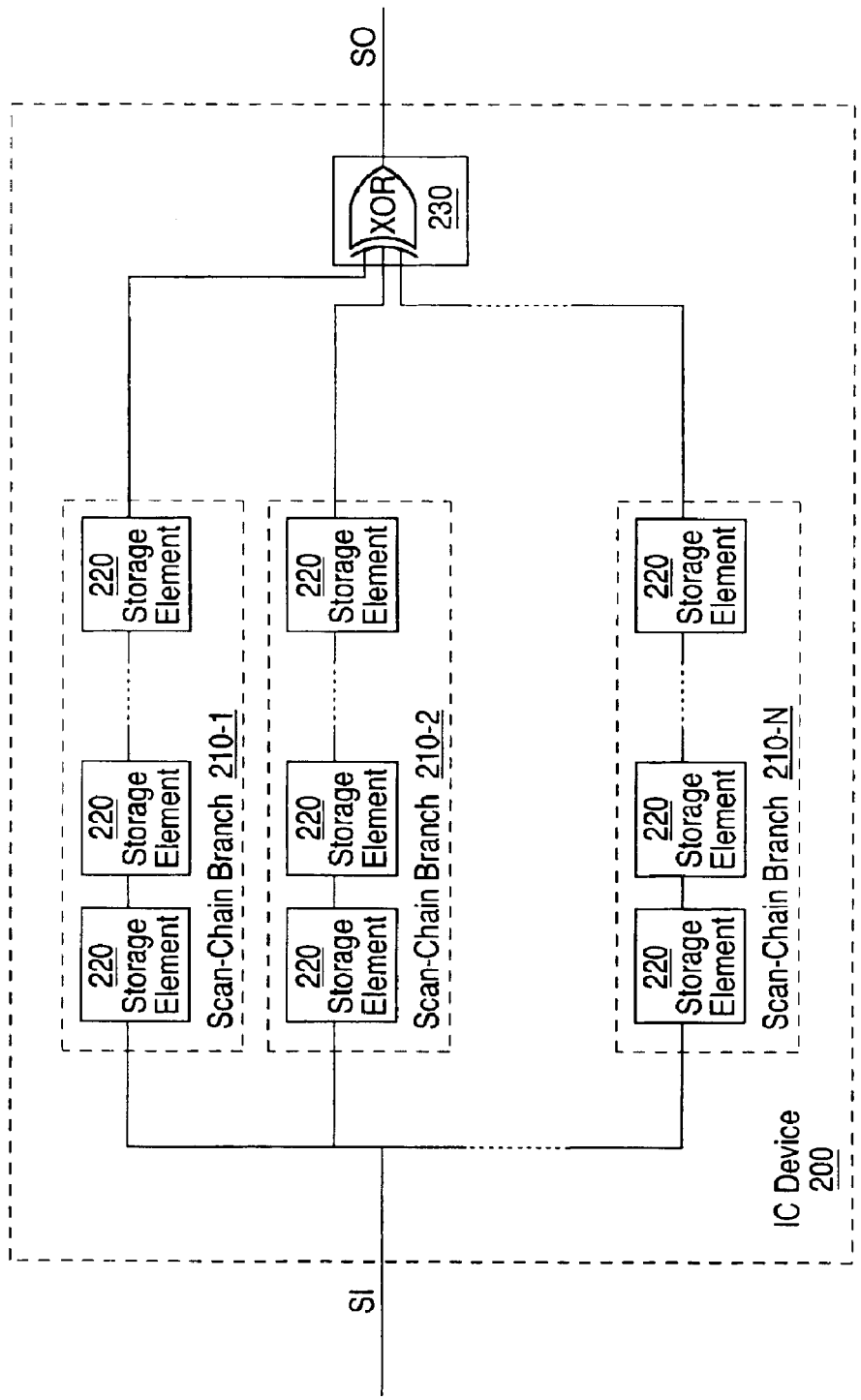
FIG. 2 shows an integrated circuit device having a parallel scan-chain architecture.
Figure 3:
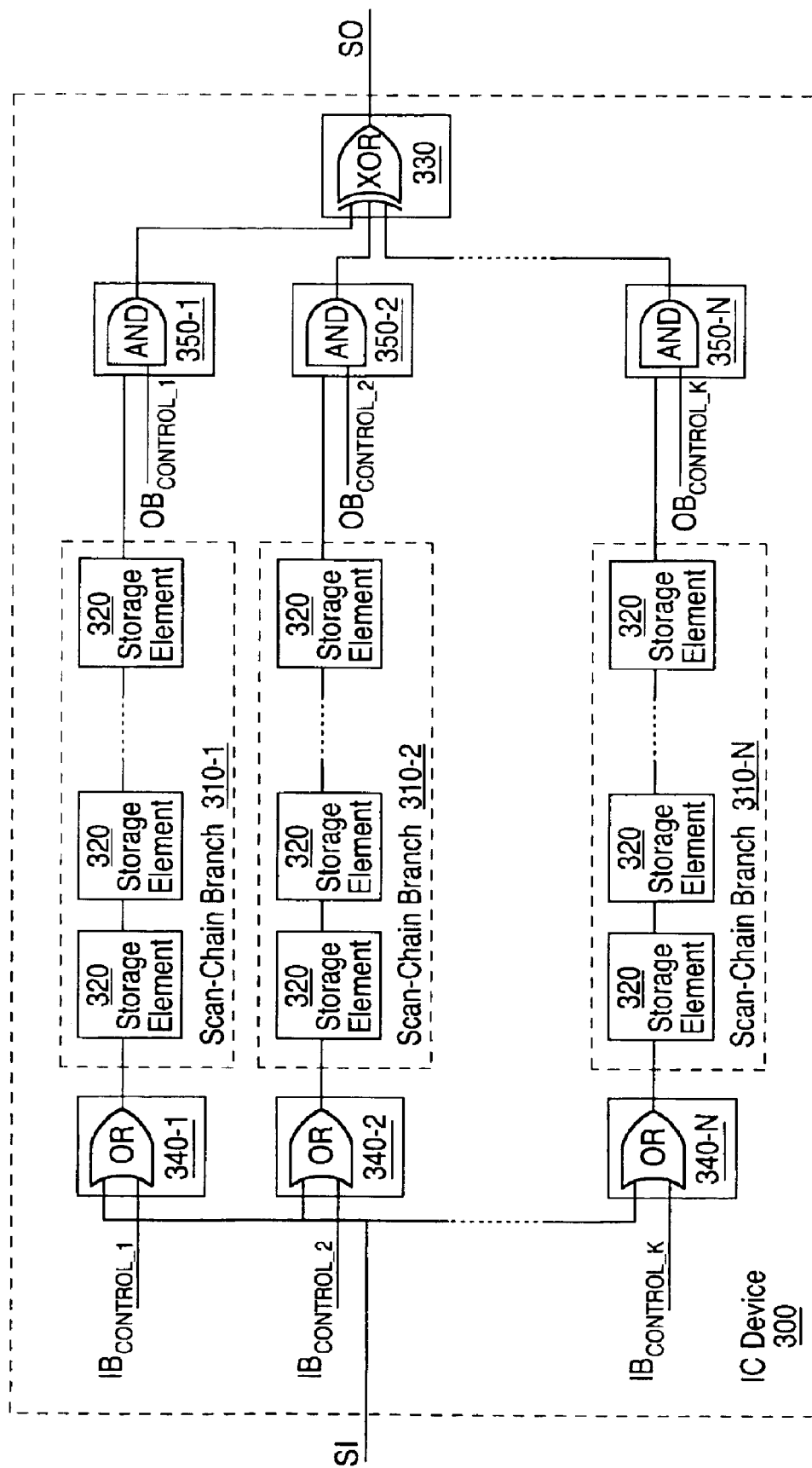
FIG. 3 shows an integrated circuit device having a parallel scan-chain architecture with input blocking circuits at the inputs of each scan-chain branch, and output blocking circuits at the outputs of each scan-chain branch, according to some embodiments of the present invention.

FIG. 3 shows an integrated circuit device 300 having a parallel scan-chain architecture, according to some embodiments of the present invention. Integrated circuit device 300 includes scan-chain branches 310 (separately labeled 310-1, 310-2, ..., 310-N), input blocking circuits 340 (separately labeled 340-1, 340-2, ..., 340-N), output blocking circuits 350 (separately labeled 350-1, 350-2, ..., 350-N), and combiner 330. Input blocking circuits 340 and output blocking circuits 350 are included in integrated circuit device to facilitate the debugging of integrated circuit device 300.

Each input blocking circuit 340 is coupled to receive test data bits via scan input signal line SI. Each input blocking circuit 340 is also coupled to receive a respective input blocking control signal via a respective input blocking control signal line $IB_{CONTROL\_K}$ (where K=1, 2, 3, ...). Input blocking control signals can be selectively provided to input blocking circuits 340 via input blocking control signal lines $IB_{CONTROL\_K}$ to block the inputs of selected scan-chain branches 310. The test data bits can be generated by external Automated Test Equipment (ATE) and provided to scan-chain branches 310 via scan input signal line SI. The test data bits can also be generated by a circuit that can be implemented within integrated circuit device 300 (e.g., a Built In Self Test (BIST) circuit).

Each input blocking circuit 340 includes an OR gate. Thus the input to a scan-chain branch 310 can be blocked by applying a logic high signal to a corresponding input blocking control signal line $IB_{CONTROL\_K}$. This causes the output of the corresponding input blocking circuit 340 to output a logic high signal regardless of the value of test data bits provided on scan input signal line SI. For example, to block the input to scan-chain branch 310-1, a logic high signal can be applied to input blocking control signal line $IB_{CONTROL\_1}$. Note that the present invention is not limited to using OR gates for the input blocking circuits 340. Rather, input blocking circuits 340 can include any type of circuit (e.g., an AND gate) that allows the inputs to scan-chain branches 310 to be selectively blocked.

Each scan-chain branch 310 is coupled to receive the output of a respective input blocking circuit 340. Each scan-chain branch 310 includes some of the storage elements 320 (e.g., flip-flops) within integrated circuit device 300. The storage elements 320 within each scan-chain branch 310 are serially coupled to one another and operate as a shift register.

Each output blocking circuit 350 is coupled to receive the output of a respective scan-chain branch 310. Each output blocking circuit 350 is also coupled to receive a respective output blocking control signal via a respective output blocking control signal line $OB_{CONTROL\_K}$ (where K=1, 2, 3, ...). Output blocking control signals can be selectively provided to output blocking circuits 350 via output blocking control signal lines $OB_{CONTROL\_K}$ to block the outputs of selected scan-chain branches 310.

Each output blocking circuit 350 includes an AND gate. Thus the output of a scan-chain branch 310 can be blocked by applying a logic low signal to a corresponding output blocking control signal line $OB_{CONTROL\_K}$. This causes the output of the corresponding output blocking circuit 350 to output a logic low signal regardless of the value of the resulting data bits output by a scan-chain branch 310. For example, to block the output of scan-chain branch 310-1, a logic low signal can be applied to output blocking control signal line $OB_{CONTROL\_1}$. Note that the present invention is not limited to using an AND gates for the output blocking circuits 340. Rather, output blocking circuits 340 can include any type of circuit (e.g., an OR gate) that allows the outputs of scan-chain branches 310 to be selectively blocked.

Combiner 330 is coupled to receive the resulting data bit streams output from each output blocking circuit 350. Combiner 330 combines the resulting data bit streams output from each output blocking circuit 350 and produces a common resulting data bit stream. The common resulting data bit stream is scanned out of integrated circuit device 300 via scan output signal line SO. The common resulting data bit stream can then be compared with expected data bits to determine whether there are any faults using Automated Test Equipment (ATE). The common resulting data bit stream can also be compared with internally stored expected data bits to determine whether there are any faults using a circuit that is implemented within integrated circuit device 300.

II. Integrated Circuit Device Testing and Debugging

A. Testing Method

Figure 4:
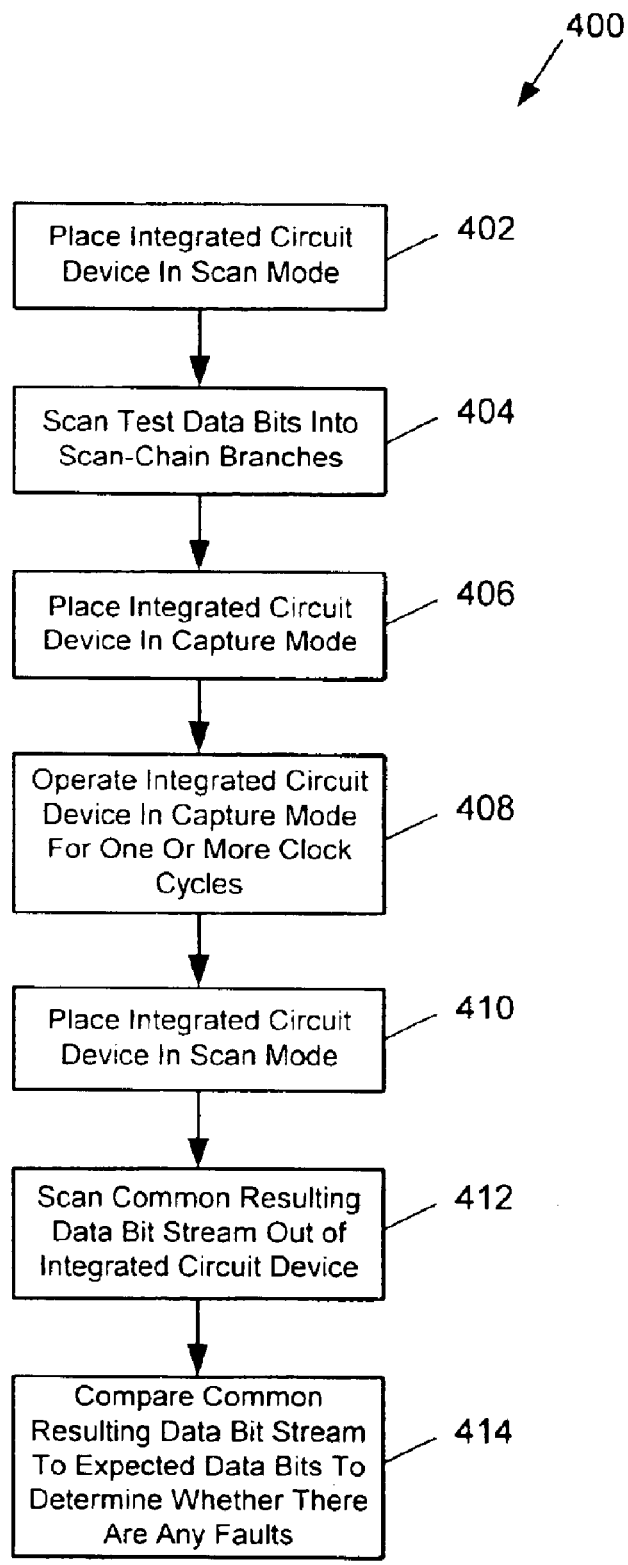
FIG. 4 shows a flow chart of an integrated circuit testing method, according to some embodiments of the present invention.

FIG. 4 shows a flow chart for an integrated circuit device testing method 400. Method 400 is described with reference to integrated circuit device 300 of FIG. 3. Method 400 can be used to determine whether there are any faults in integrated circuit device 300. If there are faults in integrated circuit device 300, methods 500 and 600 (described below) can then be used to pinpoint the location of the faults.

In step 402, integrated circuit device 300 is placed in scan mode. When placed in scan mode, multiple scan-chain branches 310 are formed with the storage elements 320 of each scan-chain branch 310 functioning as a shift register.

In step 404, test data bits are scanned into scan-chain branches 310. The test data bits are scanned into scan-chain branches 310 via scan input signal line SI. As a result, the storage elements 320 of each scan-chain branch 310 store a logic high value or a logic low value depending on the test data bit that has been scanned into that particular storage element 320. Note that identical test data bits are scanned into each scan-chain branch 310.

In step 406, integrated circuit device 300 is placed in capture mode. When placed in capture mode, the inputs and outputs of the storage elements 320 within integrated circuit device 300 are coupled to one another and/or combinational logic. The manner in which the storage elements 320 and/or the combinational logic are coupled allows the integrated circuit device to perform the functions that it was designed to perform.

In step 408, integrated circuit device 300 operates for one or more clock cycles in capture mode. Since the outputs of the storage elements 320 are provided to other storage elements 320 and/or combinational logic, the logic value of the signals at the inputs of storage elements 320 can change. When a clock pulse is applied to storage elements 320, the logic values at the inputs of storage elements 320 are stored in storage elements 320. The values stored in storage elements 320 are referred to herein as the resulting data bits.

In step 410, integrated circuit device 300 is placed in scan mode. When placed in scan mode, multiple scan-chain branches 310 are formed with the storage elements 320 of each scan-chain branch 310 functioning as a shift register.

In step 412, a common resulting data bit stream is scanned out of integrated circuit device 300. Each scan-chain branch 310 outputs a respective resulting data bit stream. The resulting data bit streams output by each scan-chain branch 310 are then provided to combiner 330. Combiner 330 combines (or compares) the multiple resulting data bit streams output by each scan-chain branch 310 and generates a single common resulting data bit stream. The common resulting data bits stream is then scanned out of integrated circuit device 330 via scan output signal line SO.

In step 414, the common resulting data bit stream is compared with expected data bits to determine whether there are any faults. The common resulting data bit stream can be provided to Automated Test Equipment (ATE), which compares the common resulting data bit stream with expected data bits. If no faults are detected (i.e., the common resulting data bit stream matches the expected data bits), then the testing process may end.

If faults are detected or there is something wrong in scan mode of one of the scan chain branches, then it is desirable to identify the location of the faults within integrated circuit device 300. As described above, it is difficult to identify the location of the faults in integrated circuit device 300 since integrated circuit device 300 has a parallel scan-chain architecture. This is because the faults can occur in one or more of scan-chain branches 310. However, each scan-chain branch 310 outputs a respective resulting data bits stream, all of which are combined into a single common resulting data bit stream by combiner 330. Thus if an error is detected in the common resulting data bit stream, it is difficult to determine which scan-chain branch or branches 310 generated the error.

The present invention addresses this problem by including input blocking circuits 340 and output blocking circuits 340 in integrated circuit device 300. The operation of input blocking circuits 340 and output blocking circuits 350 is described in detail below.

B. Scan Output Blocking Method

Figure 5:
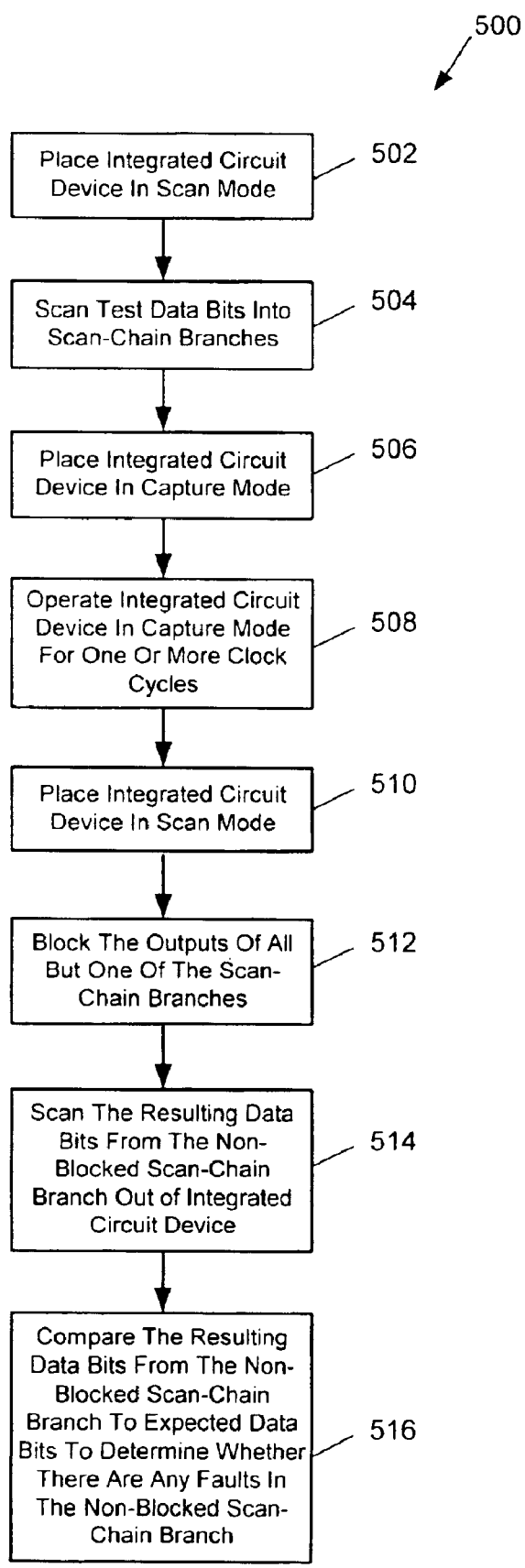
FIG. 5 shows a flow chart for an exemplary scan output blocking method, according to some embodiments of the present invention.

FIG. 5 shows a flow chart for an exemplary scan output blocking method 500, according to some embodiments of the present invention. Method 500 is described with reference to integrated circuit device 300 of FIG. 3 and FIG. 5. When debugging integrated circuit device 300, method 500 can be used to verify that the resulting data bit streams output by each scan-chain branch 310 are correct.

In step 502, integrated circuit device 300 is placed in scan mode. In step 504, test data bits are scanned into scan-chain branches 310 via scan input signal line SI. Note that identical test data bits are scanned into the storage elements 320 of each scan-chain branch 310. In step 506, integrated circuit device 300 is placed in capture mode. In step 508, integrated circuit device 300 operates for one or more clock cycles in capture mode. In step 510, integrated circuit device 300 is placed in scan mode.

In step 512, the outputs of all but one of the scan-chain branches 310 are blocked. This allows the non-blocked scan-chain branch 310 to be analyzed. For example, suppose that scan-chain branch 310-1 is the non-blocked scan-chain branch. A logic high signal is applied to output blocking control signal line $OB_{CONTROL\_1}$. This causes output blocking circuit 310-1 to output the resulting data bits from scan-chain branch 310-1. At the same time, logic low signals are applied to output blocking control signal lines $OB_{CONTROL\_2}$ through $OB_{CONTROL\_N}$. This causes output blocking circuits 350-2 through 350-N to output logic low signals. In other words, this causes the resulting data bits stored in the storage elements 310 of scan-chain branches 310-2 through 310-N to be blocked by respective output blocking circuits 350-2 through 350-N.

In step 514, the resulting data bits from the non-blocked scan-chain branch are scanned out of integrated circuit device 300. Since the output blocking circuits 350 associated with the blocked scan-chain branches each output logic low signals, the output of combiner 330 is equivalent to the output of the non-blocked scan-chain branch. For example, if scan-chain branch 310-1 is the non-blocked scan-chain branch, the resulting data bits from scan-chain branch 310-1 will be output on scan output signal line SO.

In step 516, the resulting data bits from the non-blocked scan-chain branch 310 are compared with expected data bits to determine whether any faults have been detected in the non-blocked scan-chain branch 310. For example, if scan-chain branch 310-1 is the non-blocked scan-chain branch, the resulting data bits from scan-chain branch 310-1 will be compared with expected data bits. After step 516 has been completed, method 500 returns to step 502 where the same process can be performed for scan-chain branches 310-2 through 310-N. This allows each scan-chain branch 310 to be debugged.

Those of ordinary skill in the art will recognize that method 500 greatly facilitates the process of debugging an integrated circuit device. Those of ordinary skill in the art will also recognize that method 500 can be modified in various ways to further facilitate the debugging process.

C. Scan Input Blocking Method

As described above, scan output blocking circuits 350 can be used to verify that the resulting data bit streams output by each scan-branch 310 are correct. However, there is no guarantee that the test data bits scanned into scan-chain branches 310 via scan input signal line SI are correct. If any of the test data bits scanned in via scan input signal line SI are incorrect, these incorrect test data bits can corrupt other scan-chain branches 310 and thus complicate the debugging procedure. As described below, scan input blocking circuits 340 can be used to overcome this limitation.

Figure 6:
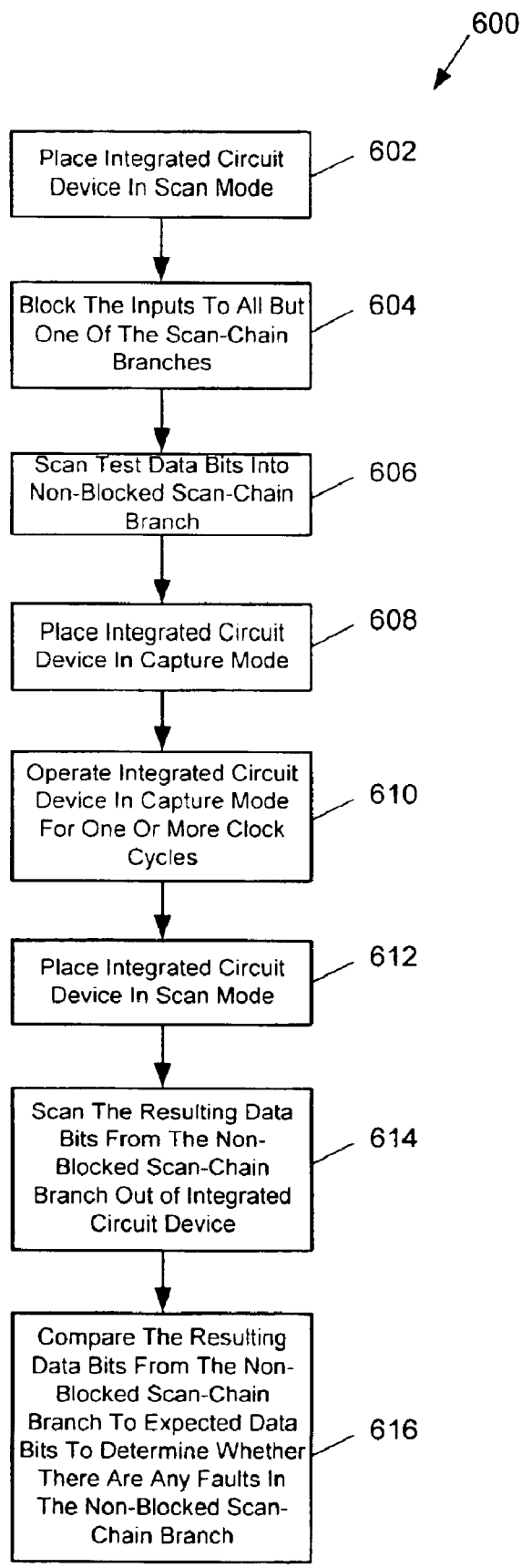
FIG. 6 shows a flow chart for an exemplary scan input blocking method, according to some embodiments of the present invention.

FIG. 6 shows a flow chart for an exemplary scan input blocking method 600, according to some embodiments of the present invention. Method 600 is described with reference to integrated circuit device 300 of FIG. 3 and FIG. 6. When debugging integrated circuit device 300, method 600 can be used to verify that the test data bits are scanned into each scan-chain branch 310 correctly.

In step 602, integrated circuit device 300 is placed in scan mode. When placed in scan mode, multiple scan-chain branches 310 are formed with the storage elements 320 of each scan-chain branch 310 functioning as a shift register.

In step 604, the inputs to all but one of the scan-chain branches 310 are blocked. This allows the non-blocked scan-chain branch 310 to be analyzed. For example, suppose that scan-chain branch 310-1 is the non-blocked scan-chain branch. A logic low signal is applied to input blocking control signal line $IB_{CONTROL\_1}$ while logic high signals are applied to input blocking control signal lines $IB_{CONTROL\_2}$ through $IB_{CONTROL\_N}$.

In step 606, test data bits are scanned into the non-blocked scan-chain branch 310 via scan input signal line SI. As a result, the storage elements 320 in the non-blocked scan-chain branch 310 store a logic high value or a logic low value depending on the test data bit that has been scanned into that particular storage element 320. For example, if scan-chain branch 310-1 is the non-blocked scan-chain branch, the test data bits are scanned into the storage elements 320 of scan-chain branch 310-1. Since the outputs of the blocked input blocking circuits 340-2 through 340-N are logic high signals, logic high values will be scanned into the storage elements 320 of their respective scan-chain branches 310.

In step 608, integrated circuit device 300 is placed in capture mode. In step 610, integrated circuit device 300 operates for one or more clock cycles in capture mode. In step 612, integrated circuit device 300 is placed in scan mode. In step 614, the resulting data bits from the non-blocked scan-chain branch are scanned out of integrated circuit device 300. Note that the scan output blocking method of section IIB is used to scan out the data bits from the selected non-blocked scan-chain branch.

In step 616, the resulting data bits from the non-blocked scan-chain branch 310 are compared with expected data bits to determine whether any faults have been detected in the non-blocked scan-chain branch 310. For example, if scan-chain branch 310-1 is the non-blocked scan-chain branch, the resulting data bits from scan-chain branch 310-1 will be compared with expected data bits. After step 616 has been completed, method 600 returns to step 602 where the same process can be performed for scan-chain branches 310-2 through 310-N. This allows each scan-chain branch 310 to be debugged.

Those of ordinary skill in the art will recognize that method 600 greatly facilitates the process of debugging an integrated circuit device. Those of ordinary skill in the art will also recognize that method 600 can be modified in various ways to further facilitate the debugging process.

While particular embodiments of the present invention have been shown and described, it will be apparent to those skilled in the art that changes and modifications may be made without departing from this invention in its broader aspect and, therefore, the appended claims are to encompass within their scope all such changes and modifications as fall within the true spirit of this invention.

What is claimed is:

1. An integrated circuit device comprising:
   a plurality of scan-chain branches, each scan-chain branch including a plurality of storage elements;
   a plurality of input blocking circuits, each input blocking circuit having an output coupled to a respective input of each scan-chain branch, each input blocking circuit being independently operable to block the input to a respective scan-chain branch;
   a plurality of output blocking circuits, each output blocking circuit having a first input coupled to a respective output of each scan-chain branch, each output blocking circuit being independently operable to block the output of a respective scan-chain branch, the plurality of output blocking circuits being selected from the group consisting of a plurality of AND gates and a plurality of OR gates; and
   a combiner having a plurality of inputs, each combiner input being coupled to a respective output of each output blocking circuit.

2. The integrated circuit device of claim 1, wherein the combiner comprises an XOR gate.

3. The integrated circuit device of claim 1 wherein each output blocking circuit includes a second input coupled to a respective control signal line.

4. The integrated circuit device of claim 1, wherein each input blocking circuit includes a first input coupled to a scan input signal line and each input blocking circuit includes a second input coupled to a respective control signal line.

5. The integrated circuit device of claim 1, wherein the plurality of input blocking circuits is selected from the group consisting of a plurality of OR gates and a plurality of AND gates.

6. An integrated circuit device comprising:
   a plurality of scan-chain branches, each scan-chain branch including a plurality of storage elements; and
   a plurality of input blocking circuits, each input blocking circuit having an output coupled to a respective input of each scan-chain branch, each input blocking circuit being independently operable to block the input of a respective scan-chain branch, the plurality of input blocking circuits being selected from the group consisting of a plurality of OR gate and a plurality of AND gates.

7. The integrated circuit device of claim 6, wherein each input blocking circuit includes a first input coupled to a scan input signal line and each input blocking circuit includes a second input coupled to a respective control signal line.

8. The integrated circuit device of claim 6, further comprising a plurality of output blocking circuits, each output blocking circuit having a first input coupled to a respective output of each scan-chain branch, each output blocking circuit being independently operable to block the output of a respective scan-chain branch.

9. The integrated circuit device of claim 8, wherein each output blocking circuit includes a second input coupled to a respective control signal line.

10. The integrated circuit device of claim 8, further comprising a combiner having a plurality of inputs, each combiner input being coupled to a respective output of each output blocking circuit.

11. The integrated circuit device of claim 8, wherein the plurality of output blocking circuits is selected from the group consisting of a plurality of AND gates and a plurality of OR gates.

12. A method for debugging an integrated circuit device having a plurality of scan-chain branches, the method comprising:
   (1) putting the integrated circuit device in scan mode;
   (2) blocking the inputs of all but one of the scan-chain branches;
   (3) scanning test data bits in parallel into the plurality of scan-chain branches;
   (4) putting the integrated circuit device in capture mode;
   (5) operating the integrated circuit device for one or more clock cycles;
   (6) putting the integrated circuit device in scan mode;
   (7) blocking outputs of all but said one of the scan-chain branches;
   (8) scanning a plurality of resulting data bits in parallel out of said one of the scan-chain branches; and
   (9) comparing common resulting data bits with a plurality of expected data bits to determine if there are one more faults in the integrated circuit device.

13. The method of claim 12 wherein said blocking the outputs of all but said one of the scan-chain branches comprises:
   applying control signals to the inputs of output blocking circuits, the output blocking circuits being selected from the group consisting of a plurality of AND gates and a plurality of OR gates.

14. The method of claim 12 wherein each scan-chain branch includes a plurality of storage elements.

15. The method of claim 12, wherein said blocking the inputs of all but one of the scan-chain branches comprises:

applying control signals to the inputs of input blocking circuits, the input blocking circuits being selected from the group consisting of a plurality of OR gates and a plurality of AND gates.

16. An integrated circuit device, comprising:

a plurality of scan-chain branches, each scan-chain branch including a plurality of storage elements;

a plurality of input logic gates, each input logic gate having (1) a first input coupled to a scan input signal line, (2) a second input coupled to a respective input control signal line, and (3) an output coupled to an input of a respective scan-chain branch, wherein the plurality of input logic gates is selected from the group consisting of a plurality of OR gates and a plurality of AND gates;

a plurality of output logic gates, each output logic gate having (1) a first input coupled to an output of a respective scan-chain branch and (2) a second input coupled to a respective output control signal line, wherein the plurality of output logic gates is selected from the group consisting of a plurality of AND gates and a plurality of OR gates; and a combiner having (1) inputs coupled to outputs of the output logic gates and (2) an output coupled to a scan output signal line; wherein the combiner comprises an XOR gate.

* * * * *